(12) United States Patent
Zhang et al.

(10) Patent No.: US 12,183,794 B2
(45) Date of Patent: Dec. 31, 2024

(54) MOSFET GATE SHIELDING USING AN ANGLED IMPLANT

(71) Applicant: Applied Materials, Inc., Santa Clara, CA (US)

(72) Inventors: Qintao Zhang, Mt Kisco, NY (US); Samphy Hong, Saratoga Springs, NY (US)

(73) Assignee: Applied Materials, Inc., Santa Clara, CA (US)

( * ) Notice: Subject to any disclaimer, the term of this patent is extended or adjusted under 35 U.S.C. 154(b) by 690 days.

(21) Appl. No.: 17/395,854

(22) Filed: Aug. 6, 2021

(65) Prior Publication Data

US 2023/0040358 A1 Feb. 9, 2023

(51) Int. Cl.
*H01L 29/423* (2006.01)
*H01L 29/16* (2006.01)
*H01L 29/40* (2006.01)

(52) U.S. Cl.
CPC ...... *H01L 29/4236* (2013.01); *H01L 29/1608* (2013.01); *H01L 29/401* (2013.01)

(58) Field of Classification Search
CPC ............. H01L 29/4236; H01L 29/1608; H01L 29/401
USPC ........................................................ 257/659
See application file for complete search history.

(56) References Cited

U.S. PATENT DOCUMENTS

| | | | | |
|---|---|---|---|---|
| 2016/0126307 | A1* | 5/2016 | Zhang | H01L 29/7809 438/270 |
| 2017/0213908 | A1* | 7/2017 | Fursin | H01L 29/407 |
| 2021/0343834 | A1* | 11/2021 | Lichtenwalner | H01L 29/1608 |
| 2021/0408279 | A1* | 12/2021 | Siemieniec | H01L 29/1608 |
| 2022/0052152 | A1* | 2/2022 | Lichtenwalner | H01L 29/0623 |
| 2022/0123140 | A1* | 4/2022 | Hsieh | H01L 21/047 |
| 2022/0130998 | A1* | 4/2022 | Kim | H01L 29/7813 |
| 2022/0157959 | A1* | 5/2022 | Kim | H01L 29/7813 |
| 2022/0165863 | A1* | 5/2022 | Zhang | H01L 29/407 |

OTHER PUBLICATIONS

Jin Wei, et al., "Dynamic Degradation in SiC Trench MOSFET with a Floating p-Shield Revealed with Numerical Simulations", IEEE Transactions on Electron Devices, vol. 64, No. 6, Jun. 2017, 7 pages.

* cited by examiner

*Primary Examiner* — Igwe U Anya
(74) *Attorney, Agent, or Firm* — KDW FIRM PLLC

(57) ABSTRACT

Methods may include providing a device structure having a shielding layer formed beneath each trench in a MOSFET to protect trench corner breakdown. The method may include providing a device structure comprising an epitaxial layer, a well over the epitaxial layer, and a source layer over the well, and providing a plurality of trenches through the device structure. The method may further include forming a shielding layer in the device structure by directing ions into the plurality of trenches.

14 Claims, 5 Drawing Sheets

MOSFET GATE SHIELDING USING AN ANGLED IMPLANT

FIELD OF THE DISCLOSURE

The present embodiments relate to semiconductor device patterning and, more particularly, to trench MOSFET gate shielding using an angled implant to enable advanced device scaling.

BACKGROUND OF THE DISCLOSURE

Low voltage power metal-oxide-semiconductor field-effect transistors (MOSFETs) are often used in load switching applications where reduction of the on-resistance ($R_{ds}$) of the device is desirable. In some applications, the $R_{ds}A$ of the device is minimized, where $R_{ds}A$ is the on-resistance of the device multiplied by the active area of the device. Additionally, low voltage power MOSFETs are commonly used in high frequency DC-DC applications.

Trench MOSFET scaling to improve device performance is a continuous goal. In some prior approaches, silicon carbide (SiC) MOSFETs require a shielding layer to protect against trench corner breakdown. The shielding layer is formed along a side of the trench, thus limiting trench to trench distance scaling.

Accordingly, improved trench formation approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure comprising an epitaxial layer, a well over the epitaxial layer, and a source layer over the well, providing a plurality of trenches through the device structure, and forming a shielding layer in the device structure by directing ions into the plurality of trenches.

In another aspect, a metal-oxide-semiconductor field-effect transistor (MOSFET) may include a device structure comprising an epitaxial layer atop a base, a well over the epitaxial layer, a source layer over the well, and a plurality of trenches through the device structure. The MOSFET may further include a shielding layer in the device structure formed by directing ions into the plurality of trenches, wherein the shielding layer extends beneath each of the plurality of trenches.

In yet another aspect, a method of forming trenches in a metal-oxide-semiconductor field-effect transistor (MOSFET), the method comprising providing a device structure comprising an epitaxial layer atop a base, a well over the epitaxial layer, and a source layer over the well. The method may further include providing a plurality of trenches through the device structure and forming a shielding layer in the device structure by directing ions into the plurality of trenches, wherein the ions are directed into a lower surface and first and second sidewalls of each of the plurality of trenches. The method may further include forming a blocking layer over the device structure including within each of the plurality of trenches following formation of the shielding layer.

BRIEF DESCRIPTION OF THE DRAWINGS

The accompanying drawings illustrate exemplary approaches of the disclosure, including the practical application of the principles thereof, as follows.

Figure 1:
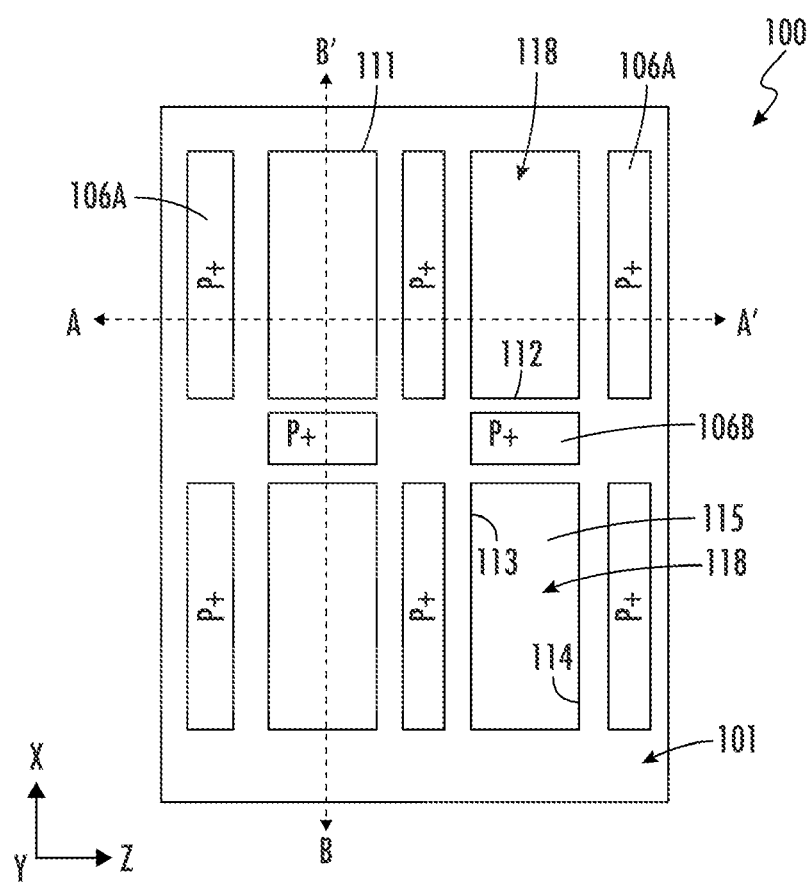
FIG. 1 is a top view of a device structure according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art Embodiments described herein advantageously provide improved cell density to enable high-trench MOSFET chip performance by moving P-type trench shielding from solely between the gates to under the gates. In some embodiments, a shielding layer may be formed beneath gates of the device structure using a directional ion implant after trenches have been formed. The ion implant may impact both the sidewalls and the bottom of each trench to increase shielding beneath the gates to protect trench corner breakdown, while also improving trench to trench distance scaling.

FIG. 1 is a simplified top view of a semiconductor device (hereinafter "device") 100, such as a MOSFET, according to one or more embodiments of the disclosure. The device 100 may include a device structure 101 including a plurality of trenches 118 formed therein. A first plurality of wells 106A may separate adjacent trenches 118 along a z-direction, while a second plurality of wells 106B may separate adjacent trenches 118 along an x-direction. Each of the trenches 118 may be defined by a first sidewall 111 opposite a second sidewall 112, a third sidewall 113 opposite a fourth sidewall 114, and a bottom surface 115. As shown, the first sidewall 111 is generally parallel to the second sidewall 112, the third sidewall 113 is generally parallel to the fourth sidewall 114, and the first and third sidewalls 111, 113 are generally perpendicular to one another.

Figure 2A:
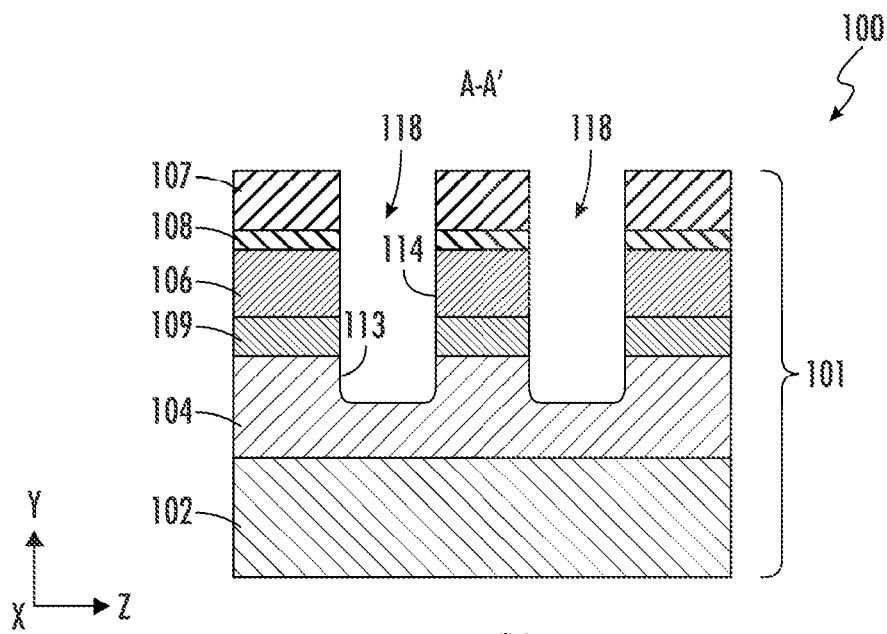
FIG. 2A is a side cross-sectional view, along cutline A-A' of FIG. 1, illustrating the device structure following formation of a set of trenches, according to embodiments of the present disclosure.
Figure 2B:
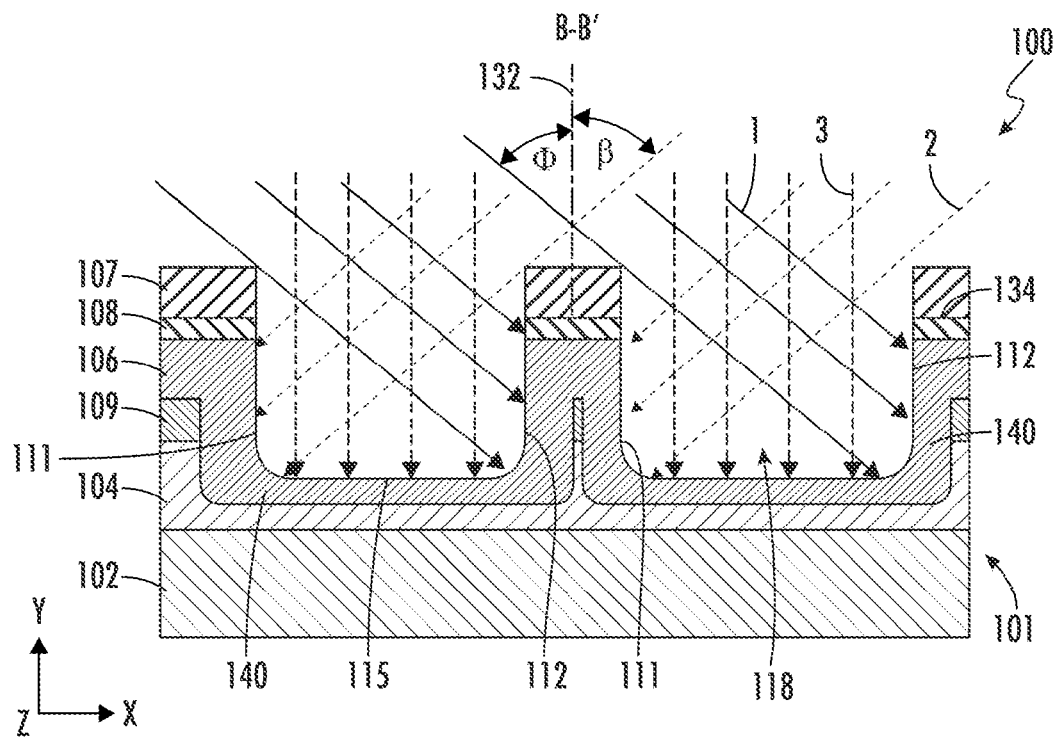
FIG. 2B is a side cross-sectional view, along cutline B-B' of FIG. 1, illustrating the device structure during formation of a shielding layer, according to embodiments of the present disclosure.

FIG. 2A is a side cross-sectional view of the device 100 along cutline A-A' of FIG. 1, while FIG. 2B is a side cross-sectional view of the device 100 along cutline B-B' of FIG. 1. The device structure 101 may include a substrate 102, an epitaxial layer 104, a well 106, and a source region or layer 108. A hardmask 107 may be formed on the source layer 108. In some embodiments, a current spreading layer (CSL) 109 may be present between the epitaxial layer 104 and the well 106. Although non-limiting, the epitaxial layer 104 may be a silicon carbide (SiC) n-type drift layer, the well 106 may be a p-type well, and the source layer 108 may be an $N^+$ source layer. Shown as a single layer, the epitaxial layer 104 may include multiple layers in other embodiments. As known, the well 106 may be formed using a plurality of doping steps or epitaxy steps. Trenches 118 may be formed through the device structure 101. FIG. 2A demonstrates the third and fourth sidewalls 113, 114, while FIG. 2B demonstrates the first and second sidewalls 111, 112. As shown, the bottom surface 115 of each trench 118 may be recessed to a depth within the epitaxial layer 104.

Next, an angled implantation process may be performed to the device 100 to direct ions into the trenches 118. As shown in FIG. 2B, first ions (1) may be delivered to the trenches 118 at a first non-zero angle of inclination φ relative to a perpendicular 132 extending from a top surface 134 of the source layer 108. The first ions may form a shielding layer 140 along the second sidewall 112 of each trench 118. In some embodiments, a dose and implant energy of the first ions may be optimized to merge p-type dopants between the trenches 118, e.g., in the x-direction.

Second ions (2) may then be delivered to the trenches 118 at a second non-zero angle of inclination β relative to the perpendicular 132. As shown, the second ions may form the shielding layer 140 along the first sidewall 111 of each trench 118. In some embodiments, a dose and implant energy of the first ions may be optimized to merge p-type dopants between the trenches 118, in the x-direction. Although non-limiting, the first and second ions may be aluminum (Al) or boron (B) directed into the device structure 101 at energy between 10 KeV and 900 KeV and with a dose between mid E13 and E14. In some embodiments, a shallow high-dose (e.g., as high as E15) Al or Boron may be included when forming the shielding layer 140 to increase oxidation rate and increase Vt, thus avoid parasitic channeling during on-stage of the device 100.

Third ions (3) may then be delivered to the bottom surface 115 of each trench 118. As shown, the third ions may be delivered perpendicular to a plane defined by the top surface 134 of the source layer 108. The third ions can be optimized to increase a depth (e.g., in the y-direction) of the shielding layer 140 beneath the trenches 118, wherein the doping concentration may be the same or different than the first and second ions. As shown between FIGS. 2A-2B, the first, second, and third ions may impact just the first sidewall 111, the second sidewall 112, and the bottom surface 115 of each trench 118. The third sidewall 113 and the fourth sidewall 114 are generally not impacted by the first, second, and/or third ions. As a result, the shielding layer 140 is formed only along the first sidewall 111, the second sidewall 112, and the bottom surface 115 of each trench 118. By forming the shielding layer 140 beneath gates (described below) of the device structure 101, trench corner breakdown can be minimized while also decreasing a distance between the gates.

Figure 3A:
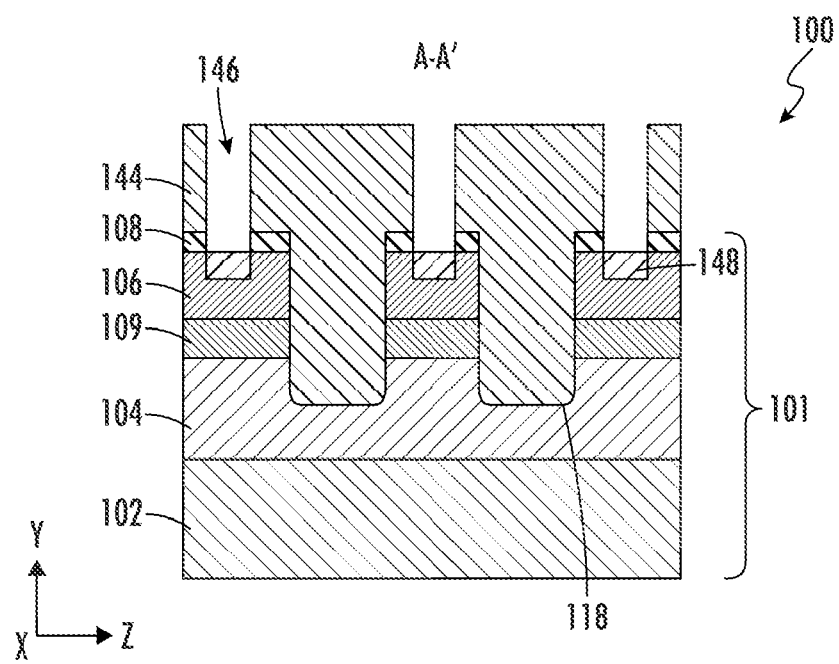
FIG. 3A is a side cross-sectional view, along cutline A-A', illustrating the device structure following formation of a plurality of contacts, according to embodiments of the present disclosure.
Figure 3B:
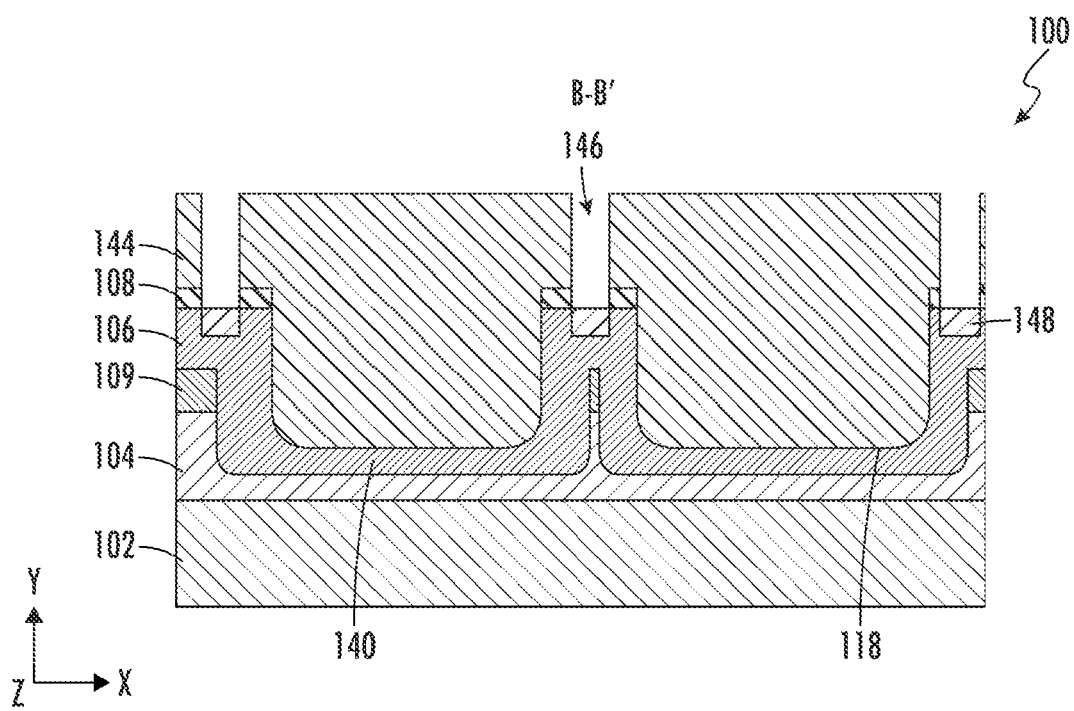
FIG. 3B is a side cross-sectional view, along cutline B-B', illustrating the device structure following formation of the plurality of contacts, according to embodiments of the present disclosure.

Next, as shown in FIGS. 3A-3B, a blocking layer 144, such as a photoresist, may be formed over the device structure 101. In some embodiments, the blocking layer 144 may also be deposited within each of the trenches 118. A plurality of contact trenches 146 may then be formed (e.g., etched) through the blocking layer 144 and the source layer 108, and a contact 148 may be formed within one or more of the contact trenches 146. As shown, the contacts 148 may be formed in the well 106. In some embodiments, the contacts 148 may be formed using an ion implant (e.g., Al and B) delivered through the contact trenches 146 at a medium energy (e.g., from 10 KeV to 1 MeV).

Figure 4A:
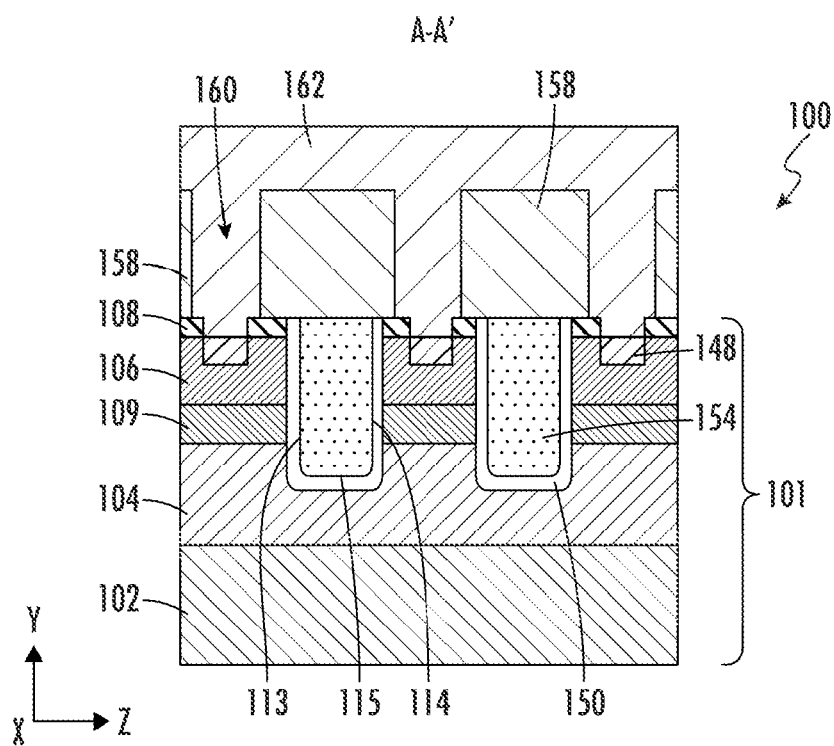
FIG. 4A is a side cross-sectional view, along cutline A-A', illustrating the device structure following formation of an interlayer dielectric and a metal material, according to embodiments of the present disclosure.
Figure 4B:
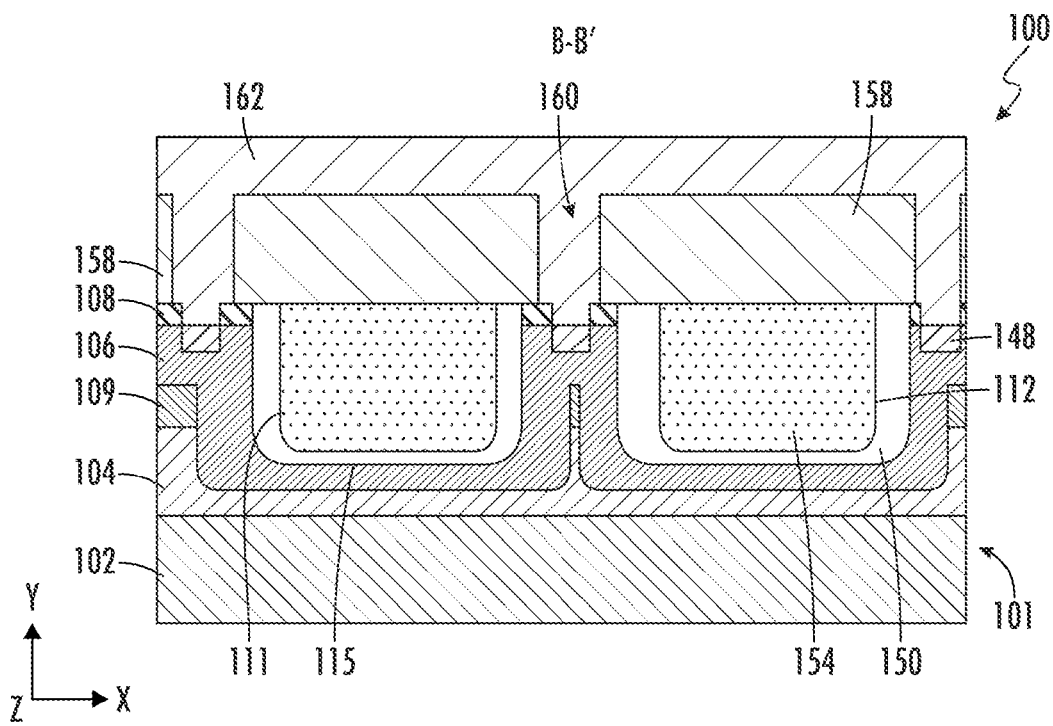
FIG. 4B is a side cross-sectional view, along cutline B-B', illustrating the device structure following formation of the interlayer dielectric and the metal material, according to embodiments of the present disclosure.
Figure 5:
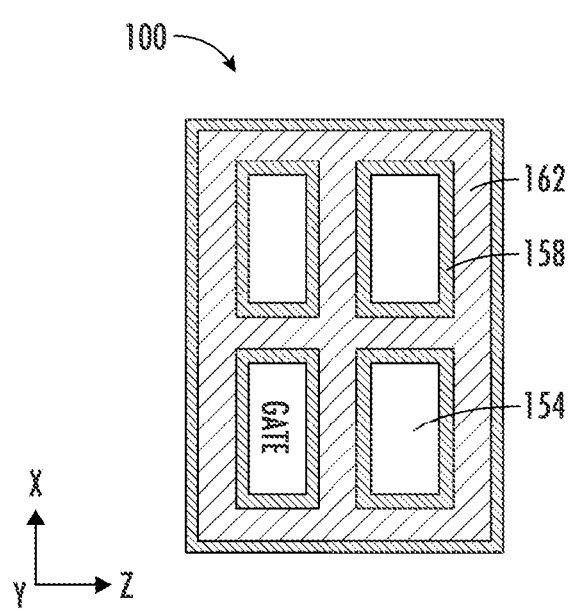
FIG. 5 is a top view of the device structure following formation of the interlayer dielectric and the metal material, according to embodiments of the present disclosure.

Next, as shown in FIGS. 4A-4B, an oxide layer 150 may be formed within each of the plurality of trenches after the blocking layer 144 is removed. As shown, the oxide layer 150 may be formed along the first sidewall 111, the second sidewall 112, the third sidewall 113, the fourth sidewall 114, and the bottom surface 115 of each trench 118. A gate material 154 may then be formed atop the oxide layer 150 within each of the trenches 118, and an interlayer dielectric (ILD) 158 may be formed over the device structure 101. The ILD 158 may be a blanket deposit of material, which is then opened by forming a second plurality of contact trenches 160 therethrough to provide access to the contacts 148. Next, a metal material 162 may be deposited over the ILD 158 including within the second plurality of contact trenches 160. The metal material 162 may connect with contacts 148. Coverage between the contacts 148 and the metal material 162 is further demonstrated in the top view of the FIG. 5.

Figure 6:
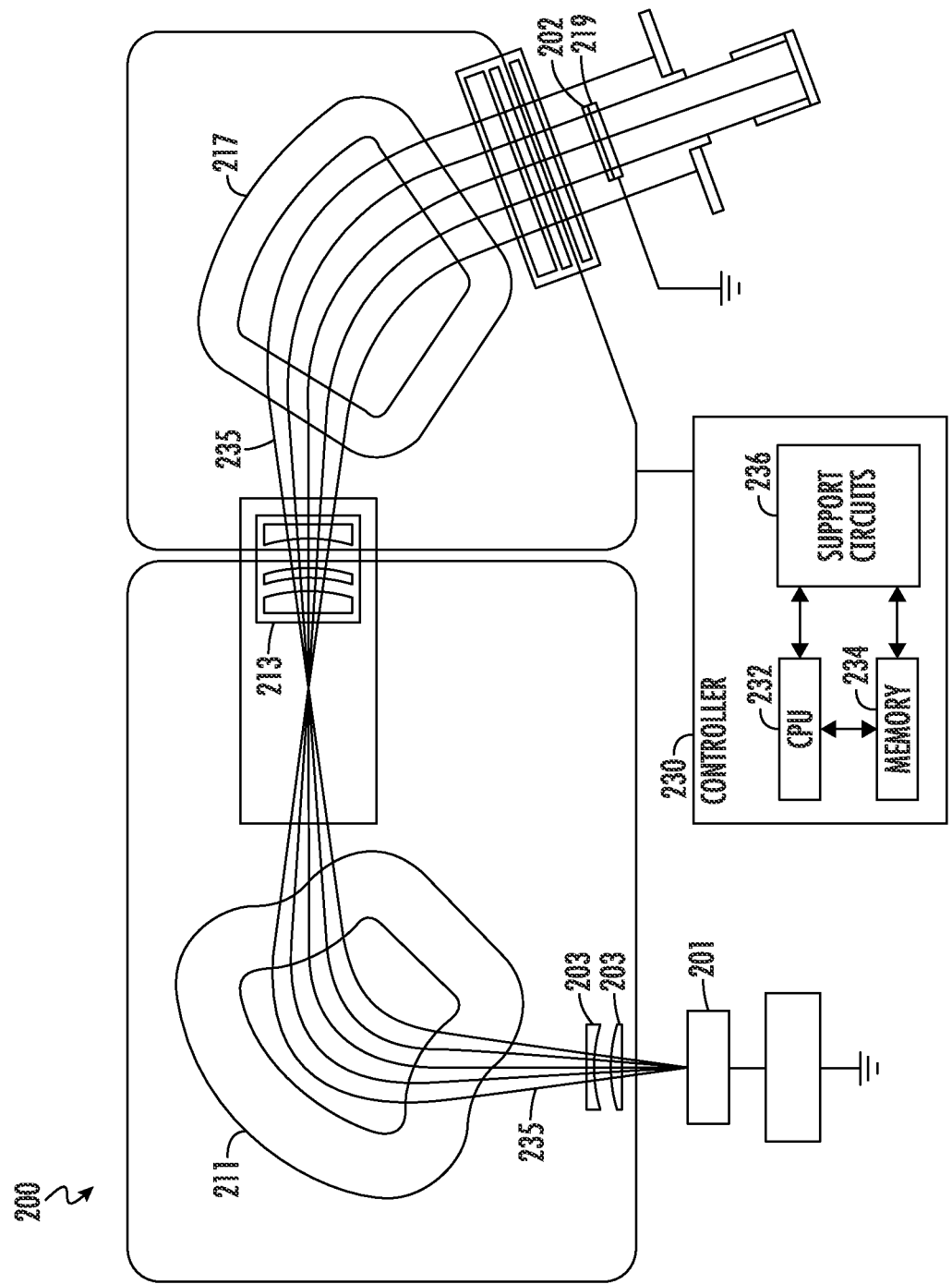
FIG. 6 illustrates a schematic diagram of a processing apparatus according to embodiments of the present disclosure.

FIG. 6 illustrates a schematic diagram of a processing apparatus 200 useful to perform processes described herein. The processing apparatus 200 may include an ion source 201 for generating ions. For example, the ion source 201 may generate ions, such as the first, second, and third ions demonstrated in FIG. 2B. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. Such computer-readable storage media, when carrying computer-readable instructions that direct the functions of the methods described herein, are embodiments of the present disclosure.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a device structure comprising an epitaxial layer, a well over the epitaxial layer, and a source layer over the well;
providing a plurality of trenches through the device structure;
forming a shielding layer in the device structure by directing ions into the plurality of trenches;
forming a plurality of contact trenches through a blocking layer and the source layer; and
forming a contact within one or more of the plurality of contact trenches.

2. The method of claim 1, further comprising:
forming an oxide layer within each of the plurality of trenches after the blocking layer is removed;
forming a gate material atop the oxide layer within each of the plurality of trenches;
forming an interlayer dielectric over the device structure;
forming a second plurality of contact trenches through the interlayer dielectric; and
depositing a metal material over the interlayer dielectric and within the second plurality of contact trenches.

3. The method of claim 1, further comprising:
providing a current spreading layer atop the epitaxial layer; and
providing a hardmask atop the source layer, wherein the plurality of trenches are formed through the hardmask, the source layer, the well, the current spreading layer, and the epitaxial layer.

4. The method of claim 1, wherein directing ions into the plurality of trenches comprises:
directing first ions into a first sidewall of each of the plurality of trenches; and
directing second ions into a second sidewall of each of the plurality of trenches, wherein the first ions and the second ions are directed at a non-zero angle of inclination relative to a perpendicular extending from a top surface of the source layer.

5. The method of claim 4, further comprising directing third ions into a bottom of the plurality of trenches.

6. The method of claim 4, wherein the first and second ions are directed into the first and second sidewalls of each of the plurality of trenches without directing the first and second ions into a third sidewall or a fourth sidewall of each of the plurality of trenches, wherein the first and second sidewalls extend parallel to one another, wherein the third and fourth sidewalls extend parallel to one another, and wherein the first sidewall extends perpendicular to the third sidewall.

7. The method of claim 1, wherein the epitaxial layer is a silicon carbide (SiC) layer, the well is a p-type well, and the source layer is an N+ source layer.

8. A method of forming trenches in a metal-oxide-semiconductor field-effect transistor (MOSFET), the method comprising:
providing a device structure comprising an epitaxial layer atop a base, a well over the epitaxial layer, and a source layer over the well;
providing a plurality of trenches through the device structure;
forming a shielding layer in the device structure by directing ions into the plurality of trenches, wherein the ions are directed into a lower surface and first and second sidewalls of each of the plurality of trenches;
forming a blocking layer over the device structure including within each of the plurality of trenches following formation of the shielding layer;
forming a plurality of contact trenches through the blocking layer and the source layer; and
forming a contact within one or more of the plurality of contact trenches.

9. The method of claim 8, further comprising:
forming an oxide layer within each of the plurality of trenches after the blocking layer is removed;
forming a gate material atop the oxide layer within each of the plurality of trenches;
forming an interlayer dielectric over the device structure;
forming a second plurality of contact trenches through the interlayer dielectric; and
depositing a metal material over the interlayer dielectric and within the second plurality of contact trenches.

10. The method of claim 8, further comprising:
providing a current spreading layer atop the epitaxial layer; and
providing a hardmask atop the source layer, wherein the plurality of trenches are formed through the hardmask, the source layer, the well, the current spreading layer, and the epitaxial layer.

11. The method of claim 8, wherein directing ions into the plurality of trenches comprises:
directing first ions into a first sidewall of each of the plurality of trenches; and
directing second ions into a second sidewall of each of the plurality of trenches, wherein the first ions and the second ions are directed at a non-zero angle of inclination relative to a perpendicular extending from a top surface of the source layer.

12. The method of claim 11, further comprising directing third ions into a bottom of the plurality of trenches.

13. The method of claim 11, wherein the first and second ions are directed into the first and second sidewalls of each of the plurality of trenches without directing the first and second ions into a third sidewall or a fourth sidewall of each of the plurality of trenches, wherein the first and second sidewalls extend parallel to one another, wherein the third and fourth sidewalls extend parallel to one another, and wherein the first sidewall extends perpendicular to the third sidewall.

14. The method of claim 8, further comprising;
forming the shielding layer to a first thickness along the lower surface of each of the plurality of trenches; and
forming the shielding layer to a second thickness along the first and second sidewalls of each of the plurality of trenches, wherein the first thickness is greater than the second thickness.

* * * * *